US008884686B2

(12) United States Patent
Nogi

(10) Patent No.: US 8,884,686 B2
(45) Date of Patent: Nov. 11, 2014

(54) DIRECT CURRENT VOLTAGE OUTPUT CIRCUIT AND SET TOP BOX

(75) Inventor: Akihiko Nogi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 95 days.

(21) Appl. No.: 13/700,558

(22) PCT Filed: Jul. 4, 2012

(86) PCT No.: PCT/JP2012/004350
§ 371 (c)(1),
(2), (4) Date: Nov. 28, 2012

(87) PCT Pub. No.: WO2013/008423
PCT Pub. Date: Jan. 17, 2013

(65) Prior Publication Data
US 2013/0145416 A1    Jun. 6, 2013

(30) Foreign Application Priority Data
Jul. 12, 2011    (JP) .................................. 2011-153879

(51) Int. Cl.
*G05F 3/02*         (2006.01)
*H04N 21/426*       (2011.01)
*H03K 17/10*        (2006.01)

(52) U.S. Cl.
CPC ............ *G05F 3/02* (2013.01); *H04N 21/42653* (2013.01); *H03K 17/102* (2013.01)
USPC ............................ 327/541; 327/540; 327/543

(58) Field of Classification Search
USPC .................................. 327/538, 540, 541, 543
See application file for complete search history.

(56) References Cited

U.S. PATENT DOCUMENTS 5,416,438 A *   5/1995   Shibata ......................... 327/552
6,256,025 B1    7/2001   Imai et al.
6,326,831 B1   12/2001   Kumagai
(Continued)

FOREIGN PATENT DOCUMENTS

JP      59-045718       3/1984
JP      61-011796       1/1986
(Continued)

OTHER PUBLICATIONS

International Preliminary Report on Patentability dated Jan. 23, 2014, for the corresponding international application No. PCT/JP2012/004350.

*Primary Examiner* — Hai L Nguyen
(74) *Attorney, Agent, or Firm* — Morgan, Lewis & Bockius LLP

(57) ABSTRACT

When the conduction state of at least one MOS transistor of a PMOS transistor (P1) and NMOS transistor (N2) is switched to an off state, current which would be applied to the MOS transistor with a conduction state in the off state due to the conduction state becoming the off state is bypassed to a resistor (R3, R4). Due to this, an MOS transistor with a conduction state in the off state being supplied with direct current power as it is can be avoided and the withstand voltage of that MOS transistor does not have to be raised. For this reason, the manufacturing costs of the direct current voltage output circuit (54a) can be kept down. At the same time, the circuit size of the direct current voltage output circuit (54a) can be made smaller.

14 Claims, 6 Drawing Sheets

(56) References Cited

U.S. PATENT DOCUMENTS

| | | |
|---|---|---|
| 6,501,321 B2 | 12/2002 | Kumagai |
| 6,844,769 B2 | 1/2005 | Yamamoto et al. |
| 6,967,378 B2 | 11/2005 | Nishikawa et al. |
| 7,880,470 B2 | 2/2011 | Amanuma |
| 7,911,086 B2 | 3/2011 | Amanuma |
| 8,008,951 B2 | 8/2011 | Isik |
| 2006/0112414 A1 | 5/2006 | Ikonen et al. |

FOREIGN PATENT DOCUMENTS

| | | |
|---|---|---|
| JP | 10-301084 | 11/1998 |
| JP | 11-121694 | 4/1999 |
| JP | 2001-045390 | 2/2001 |
| JP | 2003-318714 | 11/2003 |
| JP | 2004-260052 | 9/2004 |
| JP | 2005-051821 | 2/2005 |
| JP | 2008-252251 | 10/2008 |

\* cited by examiner

DIRECT CURRENT VOLTAGE OUTPUT CIRCUIT AND SET TOP BOX

TECHNICAL FIELD

The present invention relates to a the direct current voltage output circuit and to a set top box, more particularly relates to a direct current voltage output circuit and set top box which switch and output a plurality of voltage levels of direct current voltages for outputting control signals of standards for connecting television receivers (below, abbreviated as "TVs") or video decks or other equipment with each other.

BACKGROUND ART

There are various standards around the world which are used as the standards for connecting TVs, video decks, and other equipment together. One of these is the SCART (Syndicat des Constructeurs d'Appareils Radiorecepteurs et Televiseurs) standard which enables video signals and audio signals to be carried over a single cable between devices. This SCART standard is being adopted to a large number of apparatuses in Europe etc.

Further, set top boxes which have SCART connectors based on the SCART standard and enable TVs, video decks, etc. to be connected all together are also being utilized in large numbers. In such set top boxes, it is possible to convert the audio signals and video signals from each of the equipments to for example output signals etc. for the TVs and to output them to the TVs etc. Further, set top boxes may be connected to cable TV systems, TV antennas, audio equipment, etc. in addition to being connected to equipment using SCART connectors.

In this SCART standard, to enable the screen size of the video signal to be discerned, a direct current voltage which shows the screen size is used as a blanking signal and transferred by terminals (pins) of the SCART connectors. The direct current voltage which shows the screen size is, for example, a 12V or 6V or 0V voltage level.

For this reason, the set top box has a video blanking signal processing circuit which is provided with a direct current voltage output circuit for outputting these direct current voltages. As general direct current voltage output circuits, for example, there are the circuits which are described in the following Patent Documents 1 to 4.

These direct current voltage output circuits are configured to be provided with MOS transistors and other switching device, resistors, etc. Further, the direct current voltage output circuits are configured so that control signals which are output from control circuits etc. at the inside of the set top boxes are used to switch the conduction states of the MOS transistors and thereby output the desired voltage levels of direct current voltages.

CITATIONS LIST

Patent Documents

Patent Document 1: JP 11-121694 A
Patent Document 2: JP 2003-318714 A
Patent Document 3: JP 2004-260052 A
Patent Document 4: JP 2005-051821 A

SUMMARY OF INVENTION

Problem to be Solved

In this regard, in the above direct current voltage output circuits, as explained above, in accordance with the SCART standard, it is necessary to switch and output each voltage level of 12V or 6V or 0V. For this reason, the direct current voltage output circuits control the conduction states of the pluralities of switching devices inside the single direct current voltage output circuits so as to change the connection states of the resistors and other devices and thereby output pluralities of direct current voltages.

However, due to the connection states between resistors and other devices, when the conduction state of a switching device becomes the off state, the switching device is sometimes continuing to be supplied with the power source voltage which was used in the direct current voltage output circuit.

The power source voltage which is used in the direct current voltage output circuit is a relatively large voltage of 12V. For this reason, the switching devices which form the direct current voltage output circuit have to be ones which have large withstand voltages envisioning the same. Accordingly, there were the problems of the manufacturing costs becoming higher or the circuit sizes becoming greater.

Therefore, the present invention, in view of the above problems, has as its object the provision of a direct current voltage output circuit and set top box which can switch and output a plurality of voltage levels of direct current voltages without raising the withstand voltage of the switching devices.

Solution to the Problem

The direct current voltage output circuit and set top box according to the present invention are configured as follows to achieve the above object.

One aspect of the present invention is a direct current voltage output circuit which outputs a direct current voltage from an output terminal, the direct current voltage output circuit characterized by being provided with a set of voltage-division resistors which are connected in series between a direct current power source and the ground, voltage-division switching devices which are connected in series with the set of voltage-division resistors between the direct current power source and the ground and which switch electrical connection states of the set of voltage-division resistors, bypass resistors which are connected in parallel with the voltage-division switching devices, and a control circuit which controls the conduction states of the voltage-division switching devices.

Furthermore, when the control circuit switches the conduction state of a voltage-division switching device to an off state, it is also possible to make the current from the direct current power source be bypassed to a bypass resistor.

The voltage-division switching devices may comprise a direct current power source-side voltage-division switching device which is connected between the direct current power source and a direct current power source-side voltage-division resistor among the set of voltage-division resistors and a ground-side voltage-division switching device which is connected between the ground and a ground-side voltage-division resistor among the set of voltage-division resistors.

In another aspect of the present invention, the bypass resistors may comprise a direct current power source-side bypass resistor which is connected in parallel with the direct current power source-side voltage-division switching device and a ground-side bypass resistor which is connected in parallel with the ground-side voltage-division switching device.

When the control circuit switches the conduction state of the direct current power source-side voltage-division switching device to the off state, it may make the current from the direct current power source be bypassed to the direct current power source-side bypass resistor and when the control circuit switches the conduction state of the ground-side voltage-division switching device to the off state, it may make the current from the direct current power source be bypassed to the ground-side bypass resistor.

In another aspect of the present invention, the direct current power source-side voltage-division resistor may have a resistance value smaller than a resistance value of the direct current power source-side bypass resistor and the ground-side voltage-division resistor may have a resistance value smaller than a resistance value of the ground-side bypass resistor.

Another aspect of the present invention may comprise a first ground resistor which is connected between the ground and an intermediate connection point of the set of voltage-division resistors and a second ground resistor which is connected between the ground and the output terminal.

Further, it may further comprise a direct current voltage output switch device which is connected between the output terminal and the intermediate connection point of the set of voltage-division resistors.

When the control circuit switches the conduction states of the direct current power source-side voltage-division switching device and the direct current voltage output switching device to the on state and switches the ground-side voltage-division switching device to the off state, the voltage level of the direct current voltage which is output from the output terminal may become equal to the voltage level of the direct current power source, when the control circuit switches the conduction states of the direct current power source-side voltage-division switching device, the ground-side voltage-division switching device, and the direct current voltage output switching device to the on state, the voltage level of the direct current voltage which is output from the output terminal may become lower than the voltage level of the direct current power source, and when the control circuit switches the conduction states of the direct current power source-side voltage-division switching device, the ground-side voltage-division switching device, and the direct current voltage output switching device to the off state, the voltage level of the direct current voltage which is output from the output terminal may become equal to the voltage level of the ground.

The voltage-division switching devices may be comprised of MOS transistors.

The direct current voltage output switching devices may be comprised of MOS transistors.

In another aspect of the present invention, the voltage-division switching devices may have withstand voltages smaller than the voltage of the direct current power source.

Another aspect of the present invention is a set top box characterized by having any of the above aspects of the direct current voltage output circuit and by being provided with a video blanking signal processing circuit which outputs the direct current voltage which was output from the direct current voltage output circuit as a blanking signal, a video signal processing circuit which processes a video input signal, and an audio signal processing circuit which processes an audio input signal.

Advantageous Effects of the Invention

According to the present invention, when the control circuit is used to switch the conduction state of a voltage-division switching device to the off state, the current which would be supplied to the switching device with the conduction state in the off state due to the conduction state becoming the off state is made to be bypassed to a bypass resistor. Due to this, power source voltage is no longer supplied as is to the switching device with the conduction state in the off state and there is no need to raise the withstand voltage of the voltage-division switching device. For this reason, the manufacturing costs of the direct current voltage output circuit can be kept down and the circuit size of the direct current voltage output circuit can be made smaller.

Furthermore, the manufacturing costs of the set top box which is configured using the direct current voltage output circuit can be kept down and the size can be made smaller.

BRIEF DESCRIPTION OF THE DRAWINGS

FIG. 3 is a circuit diagram which shows a circuit configuration of a direct current voltage output circuit 54a.

DESCRIPTION OF EMBODIMENTS

From here, while referring to the attached drawings, preferable embodiments of the direct current voltage output circuit of the present invention and a set top box which is configured provided with such direct current voltage output circuits will be explained in detail.

(Hardware Configuration of Set Top Box 10)

First, referring to FIG. 1, the hardware configuration of a set top box 10 according to an embodiment will be explained.

Figure 1:
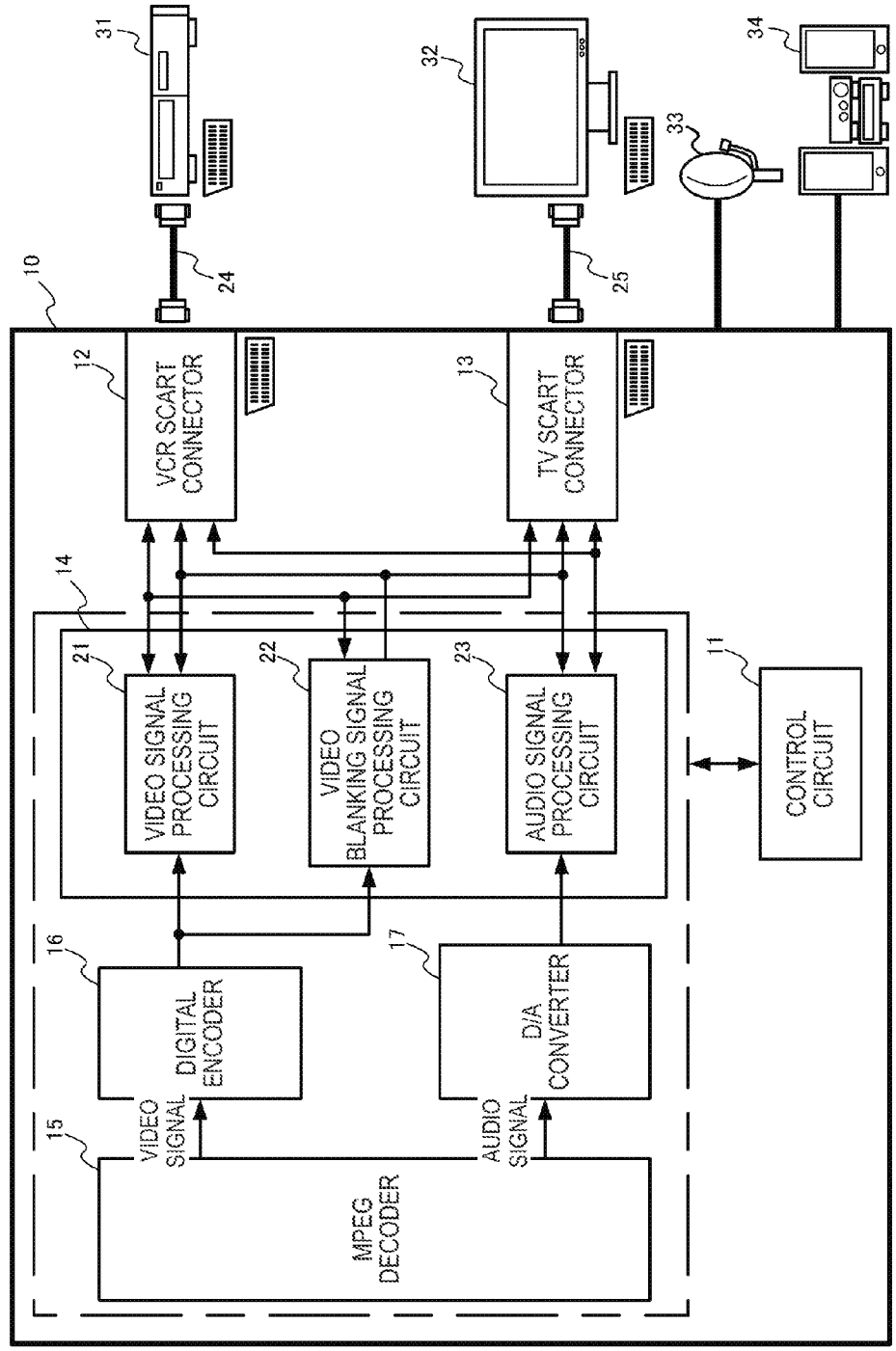
FIG. 1 is a block diagram which shows a circuit configuration of a set top box 10 according to an embodiment.

FIG. 1 is a block diagram which shows a hardware configuration of a set top box 10 according to an embodiment. The set top box 10 which is shown in FIG. 1 is comprised of a control circuit 11, VCR (video cassette recorder) SCART connector 12, TV (television) SCART connector 13, SCART switching circuit 14, MPEG decoder 15, digital encoder 16, and D/A converter 17.

The control circuit 11 sends and receives control signals with the different parts which form the set top box 10 so as to control the overall operation of the set top box 10.

The VCR SCART connector 12 is a connector which is based on the SCART standard. This VCR SCART connector 12 is connected by a SCART cable 24 to a VCR 31.

The TV SCART connector 13, like the VCR SCART connector 12, is a connector which is based on the SCART standard. This TV SCART connector 13 is connected by a SCART cable 25 to a TV 32.

Further, the set top box 10 may have a separate SCART connector in addition to the VCR SCART connector 12 and TV SCART connector 13. Further, while not shown, the set top box 10 is also provided with connectors other than the SCART connectors and is designed to be able to be connected to a television antenna 33 for receiving terrestrial broadcasts and satellite broadcasts or audio equipment 34 etc. enabling enjoyment of 5.1 channel surround.

Further, the present embodiment is a hardware configuration called a "dual SCART" which is comprised provided with the VCR SCART connector 12 and the TV SCART connector 13. However, the invention is not limited to this. The present embodiment may also be a hardware configuration where the TV 32 is a TV equipped with a VCR function and is therefore called a single SCART which is comprised provided with a TV SCART connector 13 for this purpose.

The MPEG decoder 15 performs signal processing for decoding a signal of an MPEG source which is input to the set top box 10.

The digital encoder 16 converts a video signal which has been decoded by the MPEG decoder 15 to a desired signal format.

The D/A converter 17 converts an audio signal which has been decoded by the MPEG decoder 15 from a digital signal to an analog signal format.

The SCART switching circuit 14 is provided with a video signal processing circuit 21, a video blanking signal processing circuit 22, and an audio signal processing circuit 23.

The video signal processing circuit 21 receives as input the video signal which was output from the digital encoder 16 or the video signal which was input from the VCR 31 through the VCR SCART connector 12 and produces a video signal of the SCART standard which is to be output from the VCR SCART connector 12 and TV SCART connector 13.

The video blanking signal processing circuit 22 generates a blanking signal based on the video signal which was output from the digital encoder 16 or the video signal which was input from the VCR 31 through the VCR SCART connector 12. For example, the video blanking signal processing circuit 22 generates a control signal which shows a screen size of the video signal etc.

The audio signal processing circuit 23 generates an audio signal of the SCART standard which is to be output from the VCR SCART connector 12 and TV SCART connector 13 based on the audio signal which was output from the D/A converter 17 or the audio signal which was output from the VCR SCART connector 12 and TV SCART connector 13.
(Circuit Configuration of Video Blanking Signal Processing Circuit 22)

Next, referring to FIG. 2, the circuit configuration of the video blanking signal processing circuit 22 will be explained.

Figure 2:
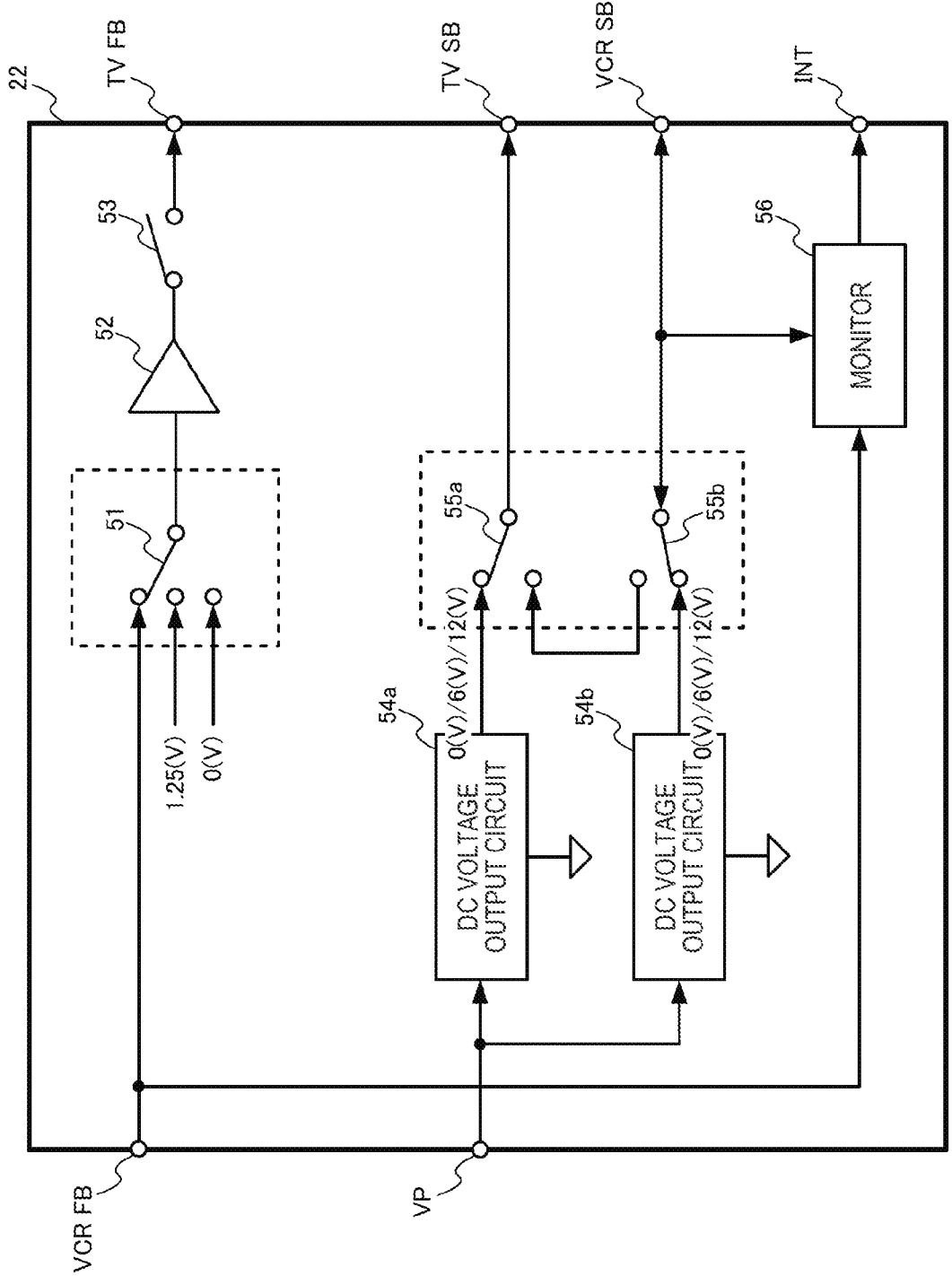
FIG. 2 is a block diagram which shows a circuit configuration of a video blanking signal processing circuit 22.

FIG. 2 is a block diagram which shows the circuit configuration of the video blanking signal processing circuit 22. The video blanking signal processing circuit 22 which is shown in FIG. 2 is comprised of a switching device 51, amplifier 52, switching device 53, direct current voltage output circuits 54a, 54b, switching devices 55a, 55b, and monitor 56.

The switching device 51 is switched in its conduction state by a control signal which is output from the control circuit 11. This switching device 51 outputs any one signal of the three signals of the FB signal for the VCR 31 which was input from the terminal VCR FB (fast blanking), a direct current voltage of a 1.25V voltage level, and a direct current voltage of a 0V voltage level.

The amplifier 52 amplifies the direct current voltage of the voltage level which was selected by the switching device 51 by a predetermined gain.

The switching device 53 is switched in its conduction state by a control signal which was output from the control circuit 11. The signal which was amplified by the amplifier 52 is output from the terminal TV FB as the FB signal for the TV 32 when the conduction state of the switching device 53 is the on state.

The direct current voltage output circuits 54a, 54b receive as input through the terminal VP from the direct current power source a 12V voltage level of direct current voltage. Further, the direct current voltage output circuits 54a, 54b output control signals which show the screen size of the video signal, that is, 12V or 6V or 0V voltage levels of direct current voltages, in accordance with control signals which are output from the control circuit 11.

The switching devices 55a, 55b are switched in conduction states by control signals which are output from the control circuit 11. One of the conduction states of the switching devices 55a, 55b is the case where the conduction states are switched so that the signal of a direct current voltage which is output from the direct current voltage output circuits 54a, 54b is output as an SB (slow blanking) signal for the TV 32 and an SB signal for the VCR 31 from the terminal TV SB and VCR SB. The other conduction state of the switching devices 55a, 55b is the case where the conduction states are switched so that the input signal which was input from the terminal VCR SB is output from the terminal TV SB.

The monitor 56 generates a predetermined pulse and outputs it from the terminal INT based on the signal which was input from the terminal VCR FB and the signal which is input and output through the terminal VCR SB as the basis to
[0032] (Circuit Configurations of Direct Current Voltage Output Circuits 54a, 54b)

Next, referring to FIG. 3, the circuit configurations of the direct current voltage output circuits 54a, 54b will be explained. Note that, the circuit configuration and operation of the direct current voltage output circuit 54b are the same as the circuit configuration of the direct current voltage output circuit 54a, so the direct current voltage output circuit 54a will be used for the explanation.

Figure 3:
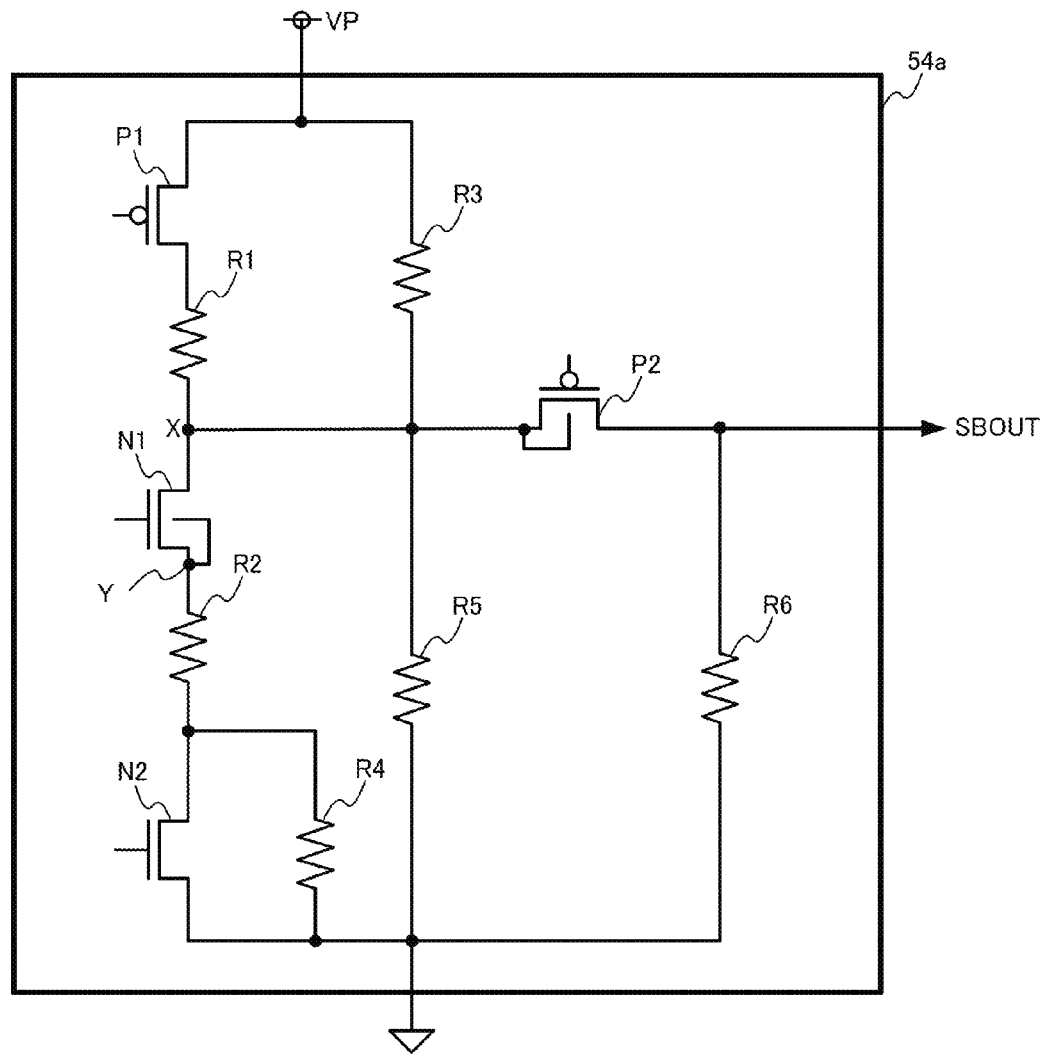

FIG. 3 is a circuit diagram which shows the circuit configuration of the direct current voltage output circuit 54a. The direct current voltage output circuit 54a which is shown in FIG. 3 is comprised of PMOS transistors P1, P2, NMOS transistors N1, N2, and resistors R1 to R6.

The resistors R1, R2 are connected in series between the terminal VP and the ground. The resistors R1, R2 form a set of two and function as voltage-division resistors for dividing the voltage level of the direct current voltage from the terminal VP.

The three MOS transistors of the PMOS transistors P1, P2 and NMOS transistor N2 which form the direct current voltage output circuit 54a are switched in conduction states in accordance with the voltage level of the control signal which is output from the control circuit 11.

The PMOS transistor P1 is connected between the terminal VP and the resistor R1. The NMOS transistor N1 is connected between the resistor R1 and the resistor R2. The NMOS transistor N2 is connected between the resistor R2 and the ground.

The two MOS transistors of these PMOS transistor P1 and NMOS transistor N2 switch the connection relationship of the resistors R1, R2 which function as voltage-division resistors by their conduction states. The PMOS transistor P1 and NMOS transistor N2 function as voltage-division switching devices for dividing the voltage level of the direct current voltage from the terminal VP. By switching of the conduction states of the MOS transistors, the voltage level of the voltage which is input from the terminal VP becomes a predetermined voltage level so as to be output.

On the other hand, this PMOS transistor P1 and NMOS transistor N2 function as voltage-division switching devices and function as MOS resistors when the conduction states of the MOS transistors become the on state.

The NMOS transistor N1 which forms the direct current voltage output circuit 54a functions as a source-follower circuit which keeps down the voltage level of the connection point Y between the resistor R2 and the NMOS transistor N1. This NMOS transistor N1 is applied a predetermined voltage level of control signal which is output from the control circuit 11. The voltage level of the connection point Y is maintained at a voltage level down from that predetermined voltage level by exactly its own threshold value. Due to this, the NMOS transistor N2 is not applied the voltage level of the direct current voltage of the connection point X between the resistor R1 and the NMOS transistor N1 as it is and there is no need to raise the withstand voltage of the NMOS transistor N2.

Further, the withstand voltages of the four MOS transistors of the PMOS transistors P1, P2 and NMOS transistors N1, N2 are smaller than the relatively large voltage which is input from the terminal VP, that is, the voltage level of the direction current voltage of 12V. They are not large withstand voltages.

The resistor R3 is connected to be parallel with the PMOS transistor P1. Further, the resistor R4 is connected to be parallel with the NMOS transistor N2. Since these resistors R3, R4 are connected in parallel to the MOS transistors in this way, when the control circuit 11 causes the two PMOS transistors P1 and NMOS transistors N2 to be switched in conduction states to the off states, the current which would be supplied to the MOS transistors is made to bypass them. That is, the resistors R3, R4 function as bypass resistors.

The direct current voltage output circuit 54a must switch among and output a plurality of voltage levels of direct current voltage, so also have to switch among connection states of the resistors R1, R2 by that amount. Therefore, it connects the resistor R3 to be parallel with the PMOS transistor P1 and further connects the resistor R4 to be parallel with the NMOS transistor N2. Due to this, no matter what the connection states of the resistors R1, R2, the current which would be applied to an MOS transistor with a conduction state in the off state can be made to be bypassed to the resistors R3, R4.

The PMOS transistor P2 is connected between a drain terminal of the NMOS transistor N1 and the output terminal SBOUT. That is, if the conduction state of the PMOS transistor P2 is the on state, the voltage which was divided by the resistors R1 to R6 (voltage of connection point X between resistor R1 and NMOS transistor N1) is output from the output terminal SBOUT. Further, if the conduction state of the PMOS transistor P2 is the off state, the divided voltage is not output from the output terminal SBOUT. That is, the PMOS transistor P2 functions as a direct current voltage output switching device.

Further, between a drain terminal of the PMOS transistor P2 and the ground, a resistor R5 is connected. Further, between a source terminal of the PMOS transistor P2 and the ground, a resistor R6 is connected. The resistors R5, R6, in the same way as resistors R3, R4, function as ground resistors for bypassing the ground.

Note that, the resistance values of the resistors R1 to R6 are made the following as one example. First, the resistance values of the resistors R1, R2 which function as voltage-division resistors are all made about 470Ω. Then, the resistance value of the resistor R3 which functions as a direct current power source-side bypass resistor is set as about 200 kΩ, and the resistance value of the resistor R4 which functions as a ground-side bypass resistor is set as about 400 kΩ. Further, the resistance value of the resistor R5 is set as about 400 kΩ, while the resistance value of the resistor R6 is set as about 100 kΩ. The load which is connected to the output terminal SBOUT is as one example about 10 kΩ or more.

Further, the withstand voltages of the four transistors of the PMOS transistors P1, P2 and NMOS transistors N1, N2 are as one example made 7.2V.

(Operation of Direct Current Voltage Output Circuits 54a, 54b)

Next, referring to FIG. 4 to FIG. 6, the operation of the direct current voltage output circuit 54a will be explained. Note that, for the explanation, the voltage levels of the direction current voltages in the circuits will be explained as 12V or 6V or 0V while ignoring the actual voltage drops due to the devices.

Figure 4:
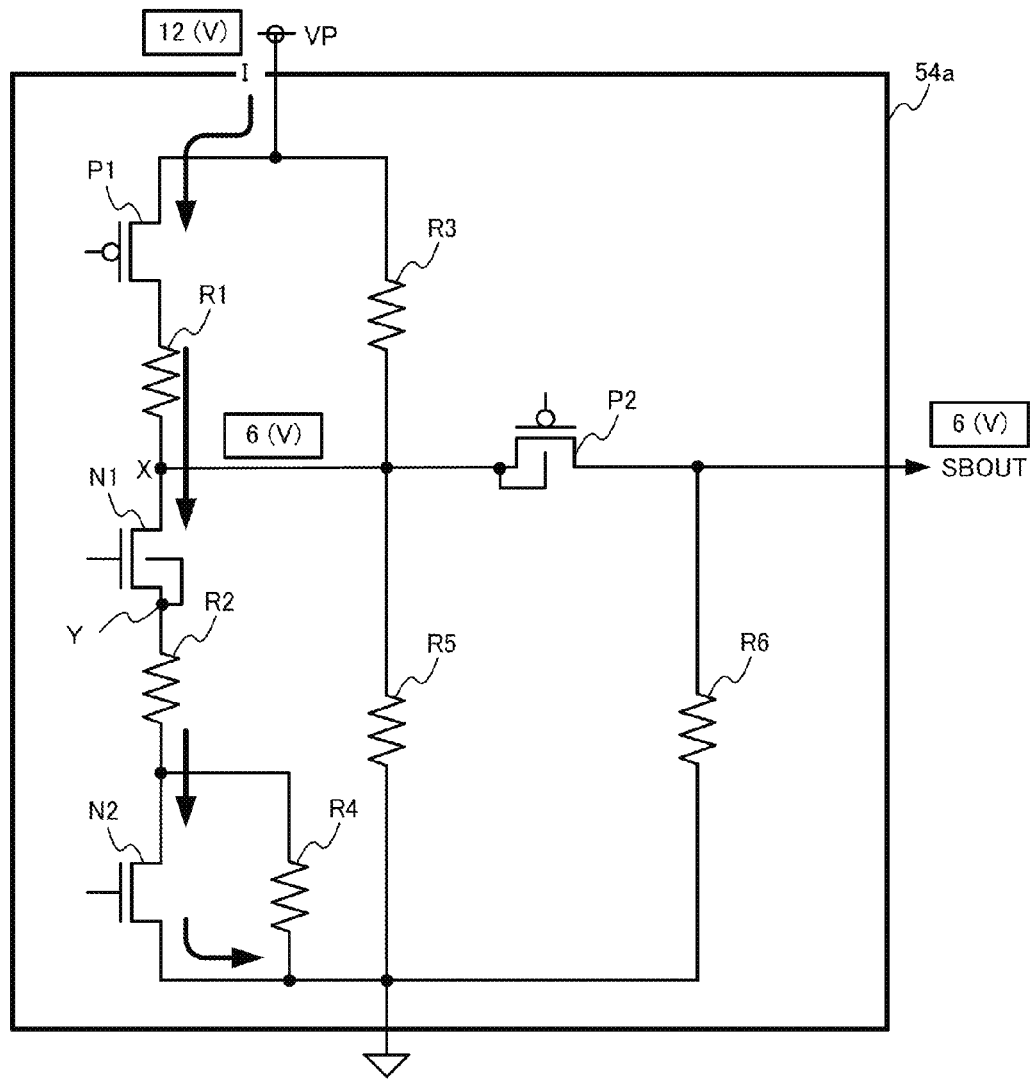
FIG. 4 is a schematic view which shows conduction states of MOS transistors and a path over which a current I flows when the direct current voltage output circuit 54a outputs a direct current voltage from an output terminal SBOUT by a 6V voltage level.

First, FIG. 4 is a schematic view which shows the conduction states of the MOS transistors and the path over which the current I flows when the direct current voltage output circuit 54a outputs direct current voltage from the output terminal SBOUT at the 6V voltage level.

When the direct current voltage output circuit 54a outputs direct current voltage from the output terminal SBOUT at the 6V voltage level, as shown in FIG. 4, the conduction states of all MOS transistors of the PMOS transistors P1, P2 and NMOS transistor N2 are switched to the on state. Here, the voltage levels of the gate terminals of the PMOS transistors P1, P2 and NMOS transistor N2 are made, as one example, 7V, 3V, and 3V. The voltage level of the gate terminal of the NMOS transistor N1 is made, as one example, 7V.

At this time, the relationship among the resistance values of the resistors R1 to R6 is R1<<R3, R2<<R5, R6. Note that, the symbol "<<" expresses that the left side is much smaller than the right side. For this reason, as shown by the arrows in FIG. 4, the current which flows from the direct current power source passes through the PMOS transistor P1, resistor R1, NMOS transistor N1, resistor R2, and NMOS transistor N2 to the ground.

At this time, due to the connection relationship of the resistors R1, R2, the 12V voltage level of the direct current voltage is divided and the voltage level of the direct current voltage of the connection point X between the resistor R1 and NMOS transistor N1 becomes 6V. Further, the conduction state of the PMOS transistor P2 is the on state. For this reason, a direct current voltage of a voltage level of 6V is output from the output terminal SBOUT.

Figure 5:
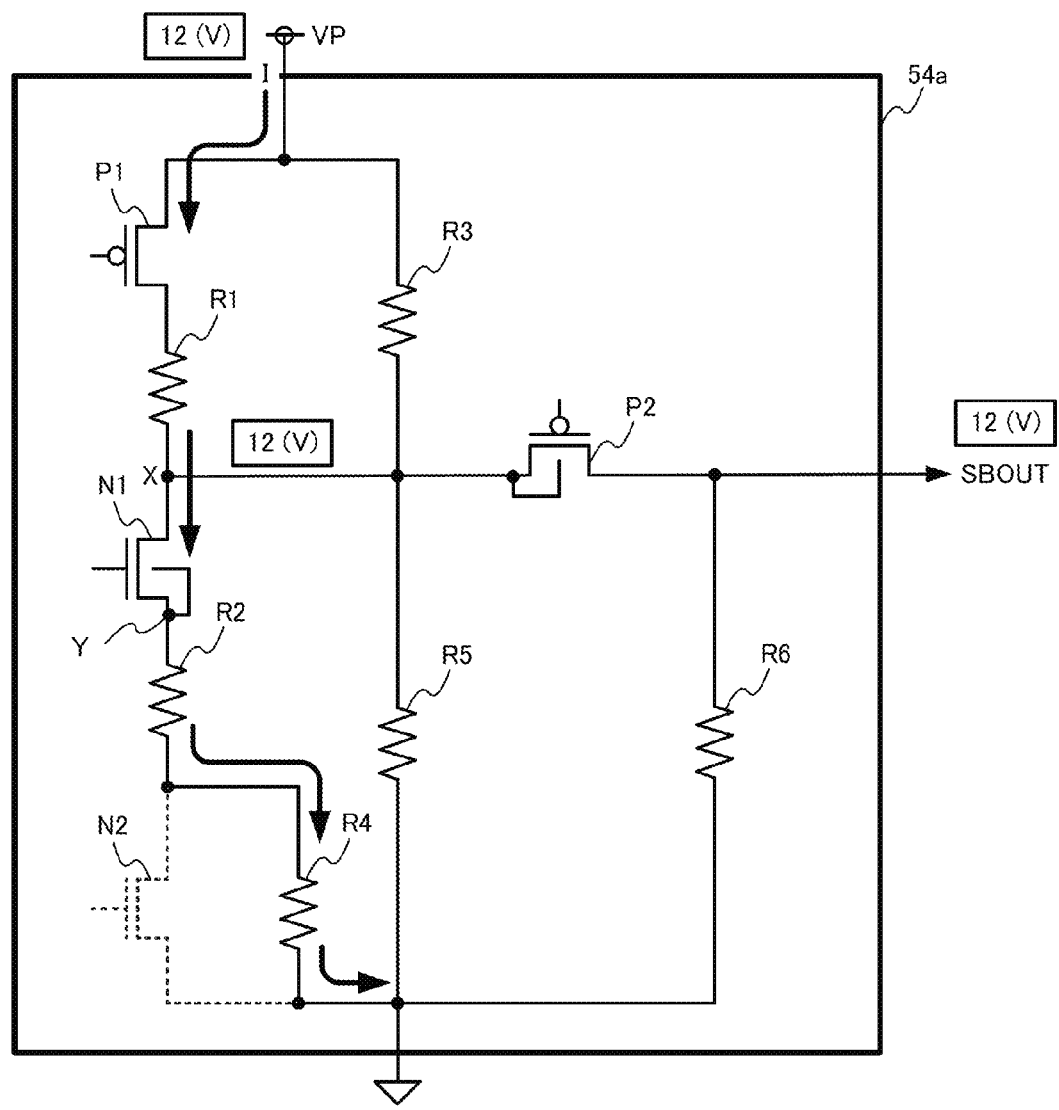
FIG. 5 is a schematic view which shows conduction states of MOS transistors and a path over which a current I flows when the direct current voltage output circuit 54a outputs a direct current voltage from an output terminal SBOUT by a 12V voltage level.

Further, FIG. 5 is a schematic view which shows the conduction states of the MOS transistors and the path over which the current I flows when the direct current voltage output circuit 54a outputs direct current voltage from the output terminal SBOUT at the 12V voltage level.

When the direct current voltage output circuit 54a outputs a direct current voltage from the output terminal SBOUT at the 12V voltage level, as shown in FIG. 5, the conduction states of the PMOS transistors P1, P2 are switched to the on states. Further, the conduction state of the NMOS transistor N2 is switched to the off state. Here, the voltage levels of the gate terminals of the PMOS transistors P1, P2 and NMOS transistor N2 are made, as one example, 7V, 7V, and 0V. The voltage level of the gate terminal of the NMOS transistor N1 is made, as one example, 7V.

At this time, the relationship of the resistance values of the resistors R1, R3 is R1<R3, so as shown by the arrows in FIG. 5, current I flows from the direct current power source through the PMOS transistor P1, resistor R1, NMOS transistor N1, resistor R2, and resistor R4 to the ground. However, the conduction state of the NMOS transistor N2 is the off state, so if the current I which flows from the direct current power source is completely blocked by the NMOS transistor N2, the direct current power source would be applied to the NMOS transistor N2 as it is. In this regard, as explained above, the resistor R4 which functions as a bypass resistor is connected in parallel to the NMOS transistor N2. For this reason, the current I which would be applied to the NMOS transistor N2 can be made to be bypassed to the resistor R4 as shown in FIG. 5.

Due to the connection relationship of the resistors R1 to R6, the voltage level of the direct current voltage of the connection point X between the resistor R1 and NMOS transistor N1 becomes 12V. Further, the conduction state of the PMOS transistor P2 is the on state. For this reason, a direct current voltage of a voltage level of 12V is output from the output terminal SBOUT.

Figure 6:
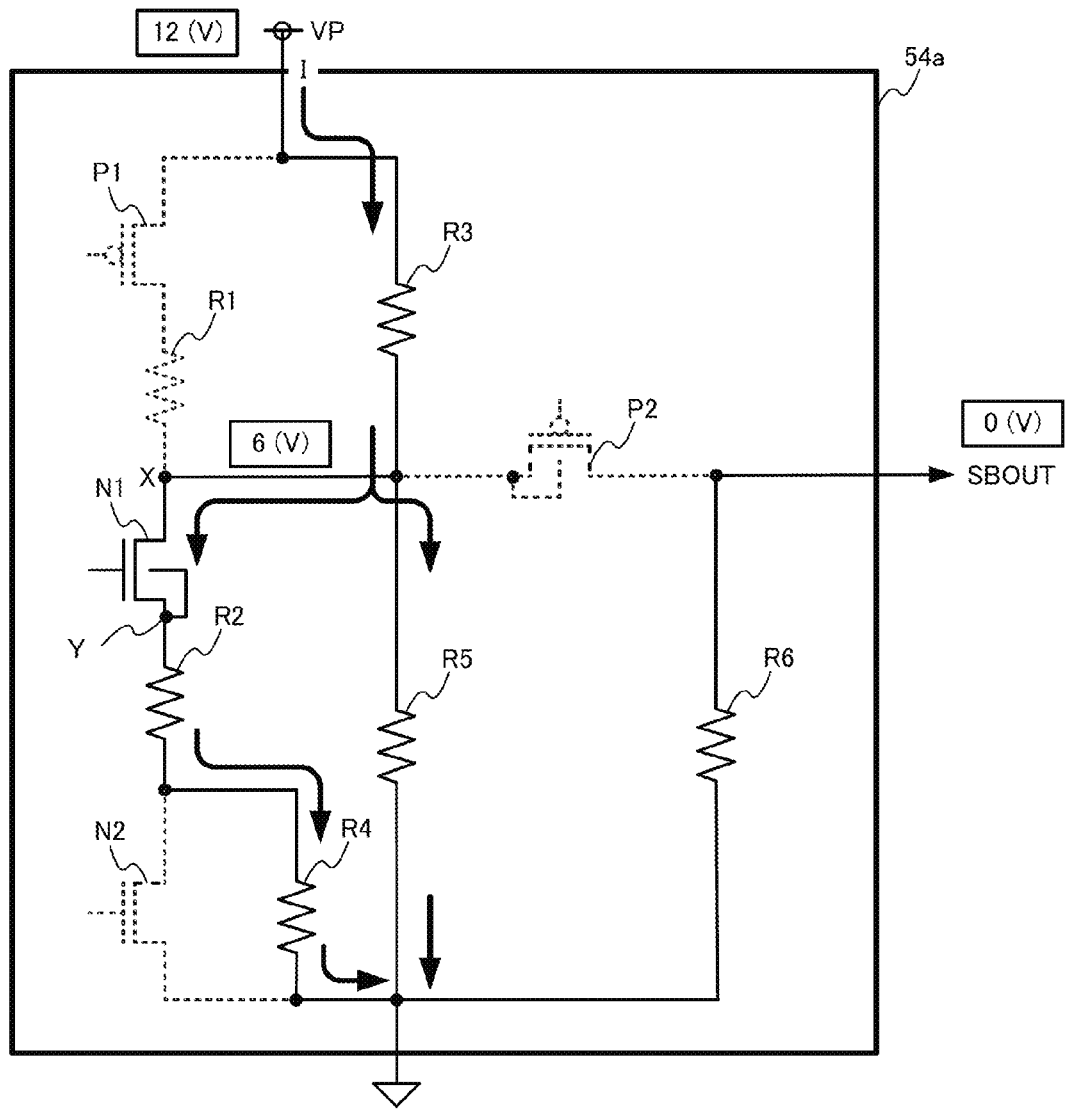
FIG. 6 is a schematic view which shows conduction states of MOS transistors and a path over which a current I flows when the direct current voltage output circuit 54a outputs a direct current voltage from an output terminal SBOUT by a 0V voltage level.

Further, FIG. 6 is a schematic view which shows the conduction states of the MOS transistors and the path over which the current I flows when the direct current voltage output circuit 54a outputs direct current voltage from the output terminal SBOUT at the 0V voltage level.

When the direct current voltage output circuit 54a outputs a direct current voltage from the output terminal SBOUT at a 0V voltage level, as shown in FIG. 6, the conduction state of the NMOS transistor N2 is switched to the off state and the conduction states of the PMOS transistors P1, P2 are switched to the off state. Therefore, the only MOS transistor with a conduction state in the on state is the NMOS transistor N1. Here, the voltage levels of the gate terminals of the PMOS transistors P1, P2 and NMOS transistor N2 are made, as one example, 12V, 7V, and 0V. The voltage level of the gate terminal of the NMOS transistor N1 is made, as one example, 7V.

At this time, as shown by the arrows in FIG. 6, the current I which flows from the direct current power source passes through the resistor R3 and, further, passes through the resistor R5 to flow to the ground and, in addition, passes through the resistor R3 and passes through the NMOS transistor N1, resistor R2, and resistor R4 to flow to the ground.

Due to the resistors R2, R3, R4, R5, the voltage level of the direct current voltage of the connection point between the resistor R1 and the NMOS transistor N1 becomes 6V and the voltage which is applied to the PMOS transistor P2 is lowered. However, the conduction state of the PMOS transistor P2 is the off state. Further, the resistor R6 is connected between the output terminal SBOUT and the ground, so the voltage level of the output terminal SBOUT becomes 0V.

Note that, the number of the devices such as the resistors R1, R2 which function as voltage-division resistors and the number of devices such as the PMOS transistor P1 and NMOS transistor N2 which function as voltage-division switching devices are not limited to the numbers explained above and may be any numbers. Therefore, the locations of connection of bypass resistors such as the resistors R3, R4 also may be any locations considering the magnitudes of the currents which are applied to the MOS transistors which function as voltage-division switching devices.

Further, the switching devices are not limited to the MOS transistors which are explained above and may also be bipolar transistors.

SUMMARY

The direct current voltage output circuits 54a, 54b according to the present embodiment, as explained above, have resistors R3, R4 which function as bypass resistors connected in parallel to the PMOS transistors P1 and NMOS transistors N2 which form the direct current voltage output circuits. For this reason, the direct current voltage output circuits 54a, 54b are designed to enable current to be bypassed to the resistors R3, R4 which are connected in parallel to these MOS transistors when the conduction states of the PMOS transistors P1 or NMOS transistors N2 are the off state. Due to this, even when the conduction states of the PMOS transistors P1 or NMOS transistors N2 are the off states, the direct current power will no longer be continuing to be applied to the PMOS transistors P1 or NMOS transistors N2. Therefore, the withstand voltages of the PMOS transistors P1 and NMOS transistors N2 can be made smaller than the case when there are no resistors R3, R4.

It is no longer necessary to use MOS transistors which have large withstand voltages for the MOS transistors which form the direct current voltage output circuits 54a, 54b, so the manufacturing costs of the direct current voltage output circuits 54a, 54b can be kept down. At the same time, the circuit sizes of the direct current voltage output circuits 54a, 54b can be made smaller.

Furthermore, the manufacturing costs of the set top box 10 which is comprised using the above explained direct current voltage output circuits 54a, 54b can be kept down and the size can be made smaller.

INDUSTRIAL APPLICABILITY

The direct current voltage output circuit of the present invention can in particular be utilized as a circuit for output of control signals of a set top box which has SCART connectors which input and output an audio signal and video signal based on the SCART standard.

Further, the direct current voltage output circuit of the present invention can be utilized as a circuit for a plurality of voltage levels of direct current voltage such as drive voltage for a matrix type display device or output voltages of various types of regulators.

REFERENCE SIGNS LIST

10 . . . set top box
11 . . . control circuit
12 . . . VCR SCART connector
13 . . . TV SCART connector
14 . . . SCART switching circuit
15 . . . MPEG decoder
16 . . . digital encoder
17 . . . D/A converter
21 . . . video signal processing circuit
22 . . . video blanking signal processing circuit
23 . . . audio signal processing circuit
51 . . . switching device
52 . . . amplifier
53 . . . switching device
54a, 54b . . . direct current voltage output circuit
55a, 55b . . . switching device
56 . . . monitor
P1, P2 . . . PMOS transistors
N1, N2 . . . NMOS transistors
R1 to R6 . . . resistors

The invention claimed is:
1. A direct current voltage output circuit that outputs a direct current voltage from an output terminal, comprising:
   a set of voltage-division resistors connected in series between a direct current power source and ground:
   voltage-division switching devices that are connected in series with the set of voltage-division resistors between the direct current power source and the ground and which switch electrical connection states of the set of voltage-division resistors;
   bypass resistors connected in parallel with the voltage-division switching devices;

a control circuit which controls the conduction states of the voltage-division switching devices;

a direct current power source-side voltage-division switching device connected between the direct current power source and a direct current power source-side voltage-division resistor among the set of voltage-division resistors;

a ground-side voltage-division switching device connected between the ground and a ground-side voltage-division resistor among the set of voltage-division resistors;

a direct current power source-side bypass resistor connected in parallel with the direct current power source-side voltage-division switching device;

a ground-side bypass resistor connected in parallel with the ground-side voltage-division switching device; and a source-follower circuit connected between the direct current power source-side voltage-division resistor and the ground-side voltage-division resistor.

2. The direct current voltage output circuit as set forth in claim 1, further comprising:

when the control circuit switches the conduction state of a voltage-division switching device to an off state, the current from the direct current power source is bypassed to a bypass resistor.

3. The direct current voltage output circuit as set forth in claim 1, wherein the voltage-division switching devices comprise MOS transistors.

4. The direct current voltage output circuit as set forth in claim 1, wherein the voltage-division switching devices withstand voltages smaller than the voltage of the direct current power source.

5. The direct current voltage output circuit as set forth in claim 1, further comprising:

when the control circuit switches the conduction state of the direct current power source-side voltage-division switching device to the off state, the current from the direct current power source is bypassed to the direct current power source-side bypass resistor; and when the control circuit switches the conduction state of the ground-side voltage-division switching device to the off state, the current from the direct current power source is made bypassed to the ground-side bypass resistor.

6. The direct current voltage output circuit as set forth in claim 5, further comprising:

the direct current power source-side voltage-division resistor has a resistance value smaller than a resistance value of the direct current power source-side bypass resistor; and the ground-side voltage-division resistor has a resistance value smaller than a resistance value of the ground-side bypass resistor.

7. The direct current voltage output circuit as set forth in claim 1, further comprising:

a first ground resistor connected between the ground and an intermediate connection point of the set of voltage-division resistors; and a second ground resistor connected between the ground and the output terminal.

8. The direct current voltage output circuit as set forth in claim 1, further comprising a direct current voltage output switching device connected between the output terminal and the intermediate connection point of the set of voltage-division resistors.

9. The direct current voltage output circuit as set forth in claim 8, further comprising:

when the control circuit switches the conduction states of the direct current power source-side voltage-division switching device and the direct current voltage output switching device to the on state and switches the ground-side voltage-division switching device to the off state, the voltage level of the direct current voltage output from the output terminal becomes equal to the voltage level of the direct current power source;

when the control circuit switches the conduction states of the direct current power source-side voltage-division switching device, the ground-side voltage-division switching device, and the direct current voltage output switching device to the on state, the voltage level of the direct current voltage output from the output terminal becomes lower than the voltage level of the direct current power source; and when the control circuit switches the conduction states of the direct current power source-side voltage-division switching device, the ground-side voltage-division switching device, and the direct current voltage output switching device to the off state, the voltage level of the direct current voltage output from the output terminal becomes equal to the voltage level of the ground.

10. The direct current voltage output circuit as set forth in claim 9, wherein the direct current voltage output switching devices comprise MOS transistors.

11. The direct current voltage output circuit as set forth in claim 9, wherein the direct current voltage output switching devices withstand voltages smaller than the voltage of the direct current power source.

12. The direct current voltage output circuit as set forth in claim 8, wherein the direct current voltage output switching devices of comprise MOS transistors.

13. The direct current voltage output circuit as set forth in claim 8, wherein the direct current voltage output switching devices withstand voltages smaller than the voltage of the direct current power source.

14. A set top box, comprising:

a video signal processing circuit which processes a video input signal; and a video blanking signal processing circuit, comprising:

a direct current voltage output circuit that outputs a direct current voltage from an output terminal, the direct current voltage output circuit comprising:

a set of voltage-division resistors connected in series between a direct current power source and ground:

voltage-division switching devices that are connected in series with the set of voltage-division resistors between the direct current power source and the ground and which switch electrical connection states of the set of voltage-division resistors;

bypass resistors connected in parallel with the voltage-division switching devices;

a control circuit which controls the conduction states of the voltage-division switching devices;

a direct current power source-side voltage-division switching device connected between the direct current power source and a direct current power source-side voltage-division resistor among the set of voltage-division resistors;

a ground-side voltage-division switching device connected between the ground and a ground-side voltage-division resistor among the set of voltage-division resistors;

a direct current power source-side bypass resistor connected in parallel with the direct current power source-side voltage-division switching device;

a ground-side bypass resistor connected in parallel with the ground-side voltage-division switching device; and a source-follower circuit connected between the direct current power source-side voltage-division resistor and the ground-side voltage-division resistor, wherein the video blanking signal processing circuit outputs the direct current voltage output as a blanking signal indicating a screen size of the video input signal.

* * * * *